(12) United States Patent
Jawarani et al.

(10) Patent No.: US 7,446,006 B2
(45) Date of Patent: Nov. 4, 2008

(54) SEMICONDUCTOR FABRICATION PROCESS INCLUDING SILICIDE STRINGER REMOVAL PROCESSING

(75) Inventors: Dharmesh Jawarani, Round Rock, TX (US); John R. Alvis, Austin, TX (US); Michael G. Harrison, Round Rock, TX (US); Leo Mathew, Austin, TX (US); John E. Moore, Austin, TX (US); Rode R. Mora, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 500 days.

(21) Appl. No.: 11/226,826

(22) Filed: Sep. 14, 2005

(65) Prior Publication Data
US 2007/0059911 A1    Mar. 15, 2007

(51) Int. Cl.
*H01L 21/336* (2006.01)
(52) U.S. Cl. .................. 438/303; 438/592; 438/595; 438/652
(58) Field of Classification Search ................ 438/303, 438/592, 595, 652
See application file for complete search history.

(56) References Cited

U.S. PATENT DOCUMENTS

| | | | | |
|---|---|---|---|---|
| 6,541,328 | B2 * | 4/2003 | Whang et al. | 438/231 |
| 6,767,777 | B2 * | 7/2004 | Joyner et al. | 438/184 |
| 2004/0211992 | A1 | 10/2004 | Joyner et al. | |

* cited by examiner

*Primary Examiner*—Jack Chen

(57) ABSTRACT

A semiconductor fabrication process includes forming a gate electrode (112) overlying a gate dielectric (114) overlying a semiconductor substrate (104) of a wafer (101) and a liner dielectric layer (116) including vertical portions (118) adjacent sidewalls of the gate electrode and horizontal portions (117) overlying an upper surface of the semiconductor substrate (104). A spacer (108) is formed adjacent a vertical portion (118) and overlying a horizontal portion (117) of the liner dielectric layer (116). After forming the spacer (108), exposed portions of the liner dielectric layer (116) are removed to form a liner dielectric structure (126) covered by the extension spacer (108). The extension spacer (108) is then etched back to expose or uncover extremities of the liner dielectric structure (126). Prior to etching back the spacer (108), a metal (130) may be sputtered deposited over the wafer (101) preparatory to forming a silicide (134). After the etch back the wafer (101) may be dipped in piranha solution and cleaned with an RF sputter (140) of argon.

7 Claims, 3 Drawing Sheets

SEMICONDUCTOR FABRICATION PROCESS INCLUDING SILICIDE STRINGER REMOVAL PROCESSING

FIELD OF THE INVENTION

The invention is in the field of semiconductor fabrication processes and, more particularly, semiconductor fabrication processes that employ silicide processing.

RELATED ART

The formation of metal-silicides on semiconductor regions of a metal oxide semiconductor (MOS) transistors is well known. Typically, a metal layer is deposited over a wafer topography that includes exposed silicon regions and dielectric regions. The wafer is then heated in an inert ambient. Where the metal layer is in contact with silicon, the metal reacts with the silicon to form a silicide (e.g., nickel silicide or cobalt silicide). Where the metal contacts dielectric, no reaction occurs. The unreacted metal portions are then selectively removed with an etch process.

Silicides are usually formed on the source/drain regions and the polysilicon gate electrode of a transistor. In many cases, the fabrication process includes forming extension spacers on sidewalls of the gate electrode. The extension spacers smooth the resulting topography and provide a means for displacing the source/drain implant from the edges of the transistor gate electrodes, which is desirable in short channel devices. Extension spacers are frequently fabricated from silicon nitride. A liner oxide is usually formed before depositing the silicon nitride to provide a stress buffer between the silicon nitride and the silicon substrate. When exposed portions of the liner oxide (those portions not underlying the extension spacer) are removed prior to depositing the silicide metal, concave notches may form in exposed ends of the liner oxide. During subsequent processing, these notched ends can promote the formation of unintended silicide "strings" (also referred to herein as silicide stringers) that can provide a short circuit or conductive path between neighboring device elements. It would be desirable to implement a silicide process that suppressed or otherwise prevented the formation of silicide stringers without substantially altering the well known silicide processing sequence.

BRIEF DESCRIPTION OF THE DRAWINGS

The present invention is illustrated by way of example and not limited by the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

Disclosed herein is a semiconductor fabrication process that prevents or removes silicide stringers that may occur when an extension spacer is formed on a liner oxide. In such processes, portions of the liner oxide overlying source/drain regions and gate electrode regions are exposed following extension spacer formation. To enable a subsequent silicide process, these portions of the liner oxide are dipped off in HF or otherwise removed. Removing exposed portions of the liner oxide may form notched extremities. Silicon may accumulate in these extremity notches during subsequent processing. The accumulated silicon may then be converted to conductive silicide that forms a conductive stringer traversing the length of the liner oxide extremity notch. Preventing the formation of these notches is achieved by etching back the extension spacer after silicide formation. The spacer etch back etches the notched extremity sufficiently to expose the stringer. Additional processing is then performed to remove the stringer. This stringer removal processing may include, as an example, bombarding the notched extremity with an inert species such as argon.

Figure 1:
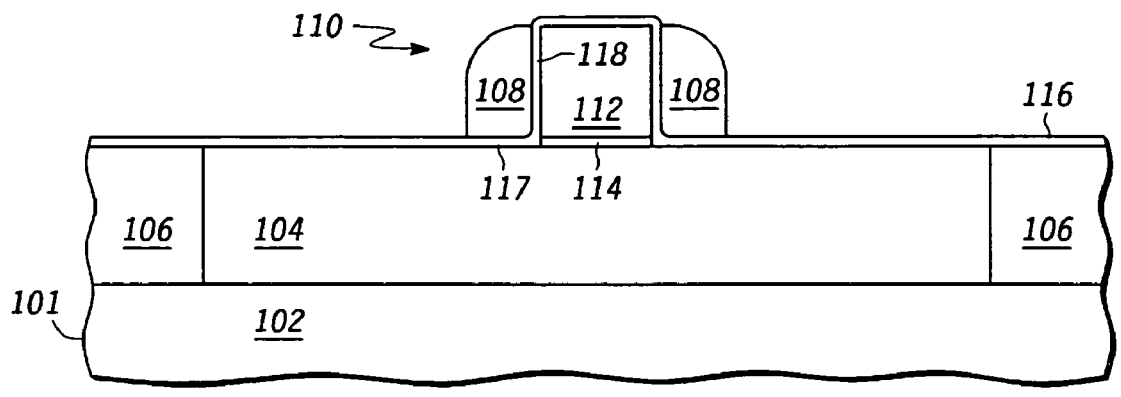
FIG. 1 is a partial cross sectional view of an integrated circuit at an intermediate stage in one embodiment of a semiconductor fabrication process emphasizing the formation of a gate module including an extension spacer formed on an oxide liner.

Turning now to the drawings, FIG. 1 is a partial cross sectional view of an integrated circuit 100 at an intermediate stage in one embodiment of a fabrication process suitable for eliminating silicide stringers. In the depicted embodiment, integrated circuit 100 is formed on a wafer 101. Wafer 101 includes a semiconductor layer 104 that overlies a dielectric layer 102. Wafer 101 may include an additional layer or layers of semiconductor or other material below buried dielectric 102. Isolation structures 106 are laterally positioned on either side of semiconductor layer 104. In an exemplary embodiment, semiconductor layer 104 is lightly or moderately doped p-type or n-type silicon and buried dielectric layer 102 is a buried silicon oxide (BOX) layer 102. Isolation structures 106 are preferably a deposited silicon oxide compound (e.g., tetraethylorthosilicate or TEOS).

A gate module 110 has been formed overlying semiconductor layer 104. Gate module 110 includes a conductive gate electrode 112 over a gate dielectric layer 114. A liner dielectric layer 116 covers an upper surface of semiconductor layer 104 and gate electrode 112. Extension spacers 108 have been formed adjacent sidewalls of gate electrode 112. Extension spacers 108 are in contact with liner dielectric layer 116.

Gate electrode 112 is preferably a heavily doped polycrystalline silicon (polysilicon) and gate dielectric 114 is preferably a thermally formed silicon dioxide. In other embodiments, gate electrode 112 may include a metal portion of TiN, TaSiN, tungsten, and other suitable metal materials. In some embodiment, gate dielectric 112 may be a high k dielectric (a dielectric having a dielectric constant greater than approximately 4.0). Suitable high k materials include metal oxide compounds such as hafnium oxide as well as suitable metal silicate, and metal nitride compounds.

Liner dielectric layer 116 is preferably a deposited silicon oxide film and extension spacers 108 are preferably silicon nitride. In other embodiments, however, alternative dielectric materials may be used for liner dielectric layer 116 and extension spacers 108. Source/drain regions, extension regions, halo implant regions, lightly doped drain regions, and the like may be formed in semiconductor layer 114 through conventional ion implantation processing. These implanted impurity distributions are omitted from the drawings for the sake of clarity.

The cross section of FIG. 1 shows wafer 101 directly after performing the spacer etch process that produced extension spacers 108. Liner dielectric layer 116 still covers the semiconductor substrate 104 and gate electrode 112. Silicide processing requires exposed portions of semiconductor on which the silicide can form.

Figure 2:
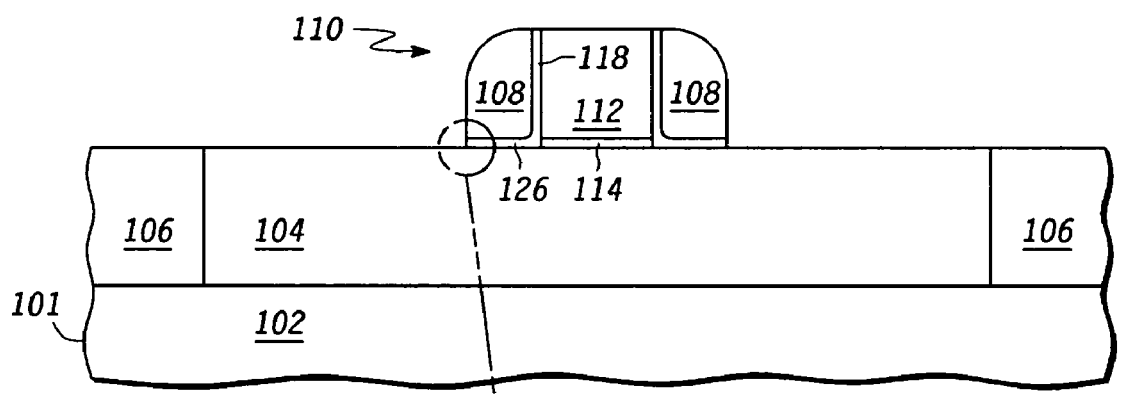
FIG. 2 depicts processing subsequent to FIG. 1 in which a liner oxide for the extension spacers is removed prior to silicide formation.

Exposing areas of semiconductor layer 104 and gate electrode 112 requires removing exposed portions of liner dielectric layer 116 (i.e., portions not covered by spacer 108). For embodiments in which liner dielectric layer 116 is a silicon oxide layer, the preferred technique for removing exposed portions of liner dielectric layer 116 is dipping wafer 101 in an HF solution according to well known processing. The removal of exposed portions of liner dielectric layer results in the formation of a liner dielectric structure 126 (FIG. 2) that supports spacer 108 (i.e., spacer 108 lies over horizontal portions 117 of liner dielectric structure 126 and adjacent to vertical portions 118 of liner dielectric structure 126).

Figure 3:
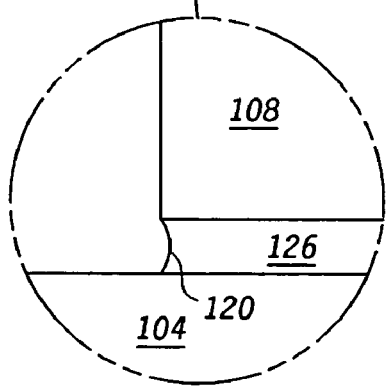
FIG. 3 is a detail view of a portion of the liner oxide of FIG. 2 revealing the formation of notched extremities in the exposed liner oxide.

Wet etching the exposed portions of liner dielectric layer 116 may unintentionally and undesirably etch portions of dielectric 126. The detail view of FIG. 3, for example, illustrates concave notches 120 in the extremities of liner dielectric structure 126 caused by wet etching the liner dielectric. Although notches of other shapes and configuration may result from wet etching the liner dielectric, the exemplary notches 120 depicted in FIG. 3 have been observed by transmission electron microscopes (TEMs) on actual wafers. Notches 120 may extend in a direction perpendicular to the plane of cross section for the entire length of the gate structure 110. Notches 120 are believed to cause or contribute to the formation of unwanted silicide stringers during subsequent silicide processing when silicon or another semiconductor material fills a notch 120 and is converted to silicide during silicide processing.

Figure 4:
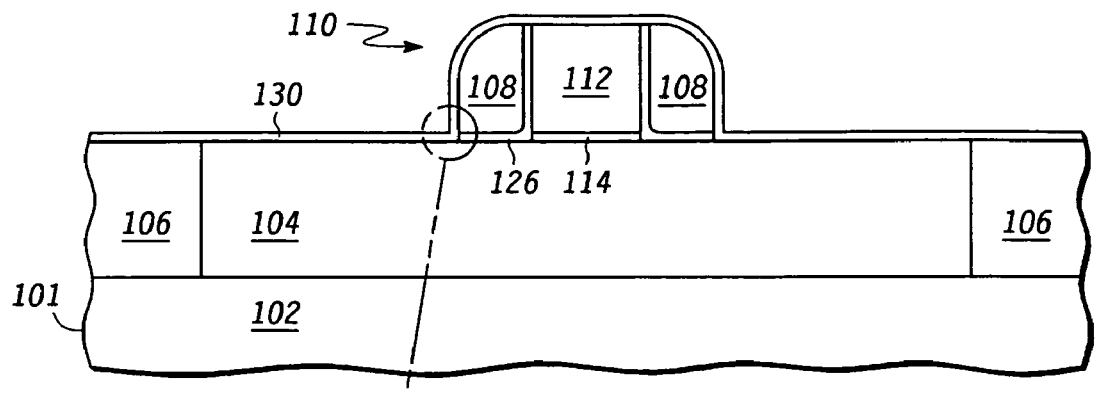
FIG. 4 depicts processing subsequent to FIG. 2 in which a metal layer is deposited on the wafer preparatory to silicide formation.

Referring now to FIG. 4, a metal layer 130 is non-selectively deposited over wafer 101. Metal layer 130 is deposited on the exposed portions of semiconductor layer 104 on either side of gate electrode 110 as well as on an upper surface of gate electrode 112. Metal layer 130, according to one embodiment, is a refractory metal or a transition metal such as titanium, cobalt, nickel, palladium, or platinum. Metal layer 130 may include a barrier overlayer such as a titanium nitride layer.

In the preferred implementation, metal layer 130 is deposited with a physical vapor deposition (PVD) and, more specifically, with a radio frequency (RF) sputter deposition process. RF sputtering is well known technique for depositing a variety of thin films, especially metal and transition metal films. RF sputtering processes typically include a pre-clean step in which the wafer is cleaned by sputter etching and/or plasma etching. If a sputter clean is used, silicon atoms in semiconductor layer 104 may be sputtered (dislodged) and some of these sputtered atoms in the vicinity of extremity notch 120 may be unintentionally "deposited" on the sidewalls within notch 120 and thereby form an unintended silicon stringer 122, which is depicted in the detail view of FIG. 5. In the depicted illustration, stringer 122 conforms to a portion of the sidewall of extremity notch 120 and is inclined with respect to an upper surface of wafer 101. Stringer 122 may extend perpendicular to the plane of cross section for the length of gate electrode 110. The concave and included extremity notch 120 protects silicon stringer 122 from being removed once it is formed.

Figure 5:
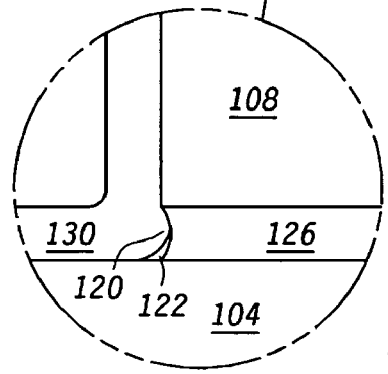
FIG. 5 is a detail view of the liner oxide notched extremity of FIG. 4 illustrating the formation of silicon structures in the notched extremity of the liner oxide.
Figure 6:
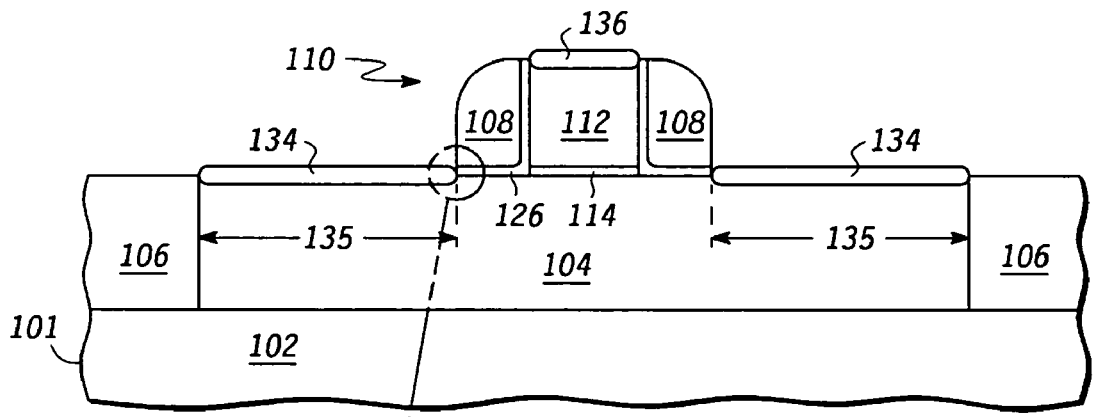
FIG. 6 depicts processing subsequent to FIG. 5 in which the silicide is formed selectively over the source/drain and gate electrode regions.
Figure 7:
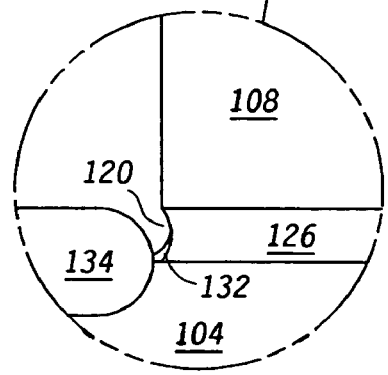
FIG. 7 is a detail view of the liner oxide notched extremity of FIG. 6 illustrating the formation of a silicide stringer in the notched extremity.

Referring to FIG. 6, conventional silicide processing is performed to form source/drain silicide structures 134 and gate electrode silicide structures 136. The conventional silicide processing includes annealing wafer 101 one or more times by subjecting wafer 101 to an inert ambient heated to a temperature in the range of approximately 300 to 700° C. for a duration of between 10 and 600 seconds. During the anneal, which forms silicide structures 134 and 136 selectively over exposed upper surfaces of the source/drain regions 135 and gate electrode 112 respectively, the unintended silicon stringer 122 of FIG. 5 is in contact with or in close proximity to metal layer 130. Annealing may cause metal layer 130 to react with silicon stringer 122 and "convert" silicon stringer 122 to an electrically conductive silicide stringer 132 depicted in the detail view of FIG. 7.

Figure 8:
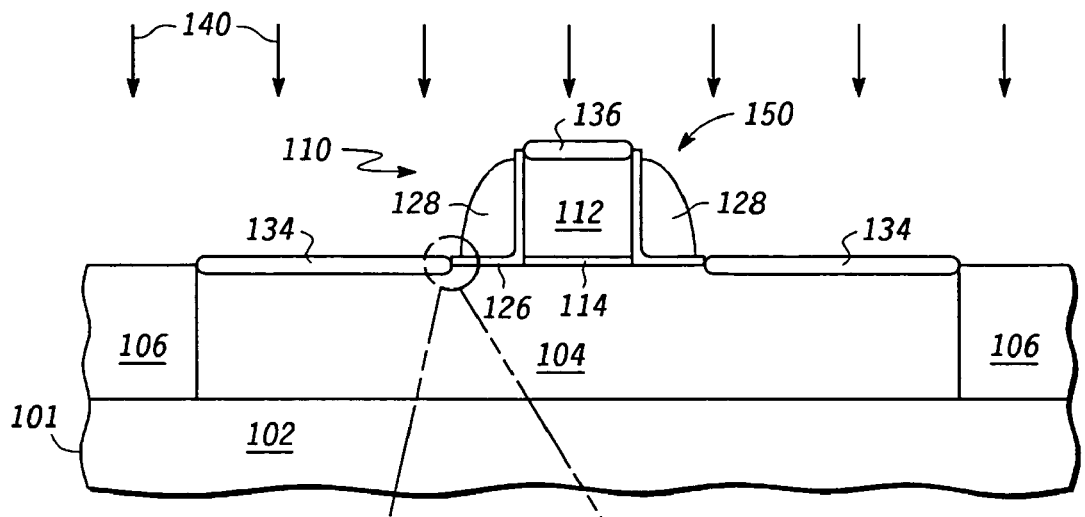
FIG. 8 depicts processing subsequent to FIG. 6 in which additional processing, including etching back the extension spacer, is performed to expose the silicide stringer trapped in the notched liner region.

The fabrication processing described herein includes processing to remove silicide stringer 132 from wafer 101. The stringer removal processing may include etch processing, sputter or other PVD processing, or a combination thereof. Referring to FIG. 8 and the detail views of FIG. 9 and FIG. 10, additional processing is performed to eliminate silicide stringers 132 of FIG. 7 and complete the formation of transistor 150.

In the embodiment depicted in FIG. 8, additional processing to eliminate silicide stringers 132 includes etching back extension spacer 108 (of FIG. 6) to form a reduced extension spacer 128. The extent of the etch back is an implementation detail, but the etch back is preferably sufficient to expose or uncover the portion of dielectric structure 126 containing the silicide stringer 132 of FIG. 7. As an example, it is believed that a spacer etch back of approximately 8 to 20 nm is sufficient for an implementation in which the extension spacers have a lateral dimension of approximately 60 nm. The spacer etch back is preferably followed by the cleaning step, such as a standard piranha dip (i.e., a heated solution of sulfuric acid and hydrogen peroxide) to remove contaminants that may have been introduced by the etch back.

Figure 9:
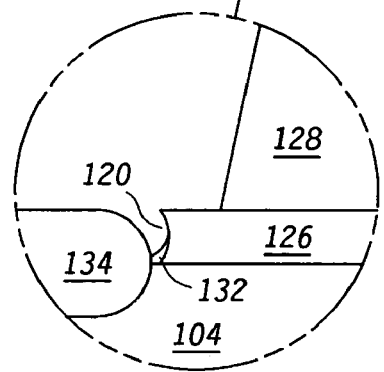
FIG. 9 is a detailed view of the liner oxide notched extremity of FIG. 8 after spacer etch back for an implementation in which the extension spacer etch back is at least somewhat selective with respect to the liner oxide extremity.
Figure 10:
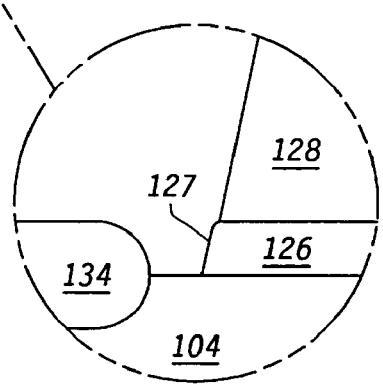
FIG. 10 depicts processing subsequent to FIG. 9 in portion of the liner dielectric structure exposed by the spacer etch back are removed with an argon sputter.

In an embodiment exemplified by the detail view of FIG. 9, the spacer etch back is at least somewhat selective with respect to liner dielectric structure 126 such that extremity notch 120 and silicide stringer 132 may remain after completion of the spacer etch back. In this embodiment, additional processing required to remove silicide stringers 132 may include an RF sputter (represented in FIG. 8 by reference numeral 140) process preferably using an inert gas such as argon. In this embodiment, the sputter process produces large, energetic ions of argon that physically dislodge or otherwise eliminate the exposed portion of dielectric structure 126 containing extremity notch 120 and silicide stringer 132 while simultaneously creating a convex profile 127 at the edge of the remaining portion of liner dielectric structure 126 to prevent the subsequent formation of additional stringers. FIG. 10 depicts a wafer after completion of the sputter etch. The post silicide processing described herein is thus suitable for eliminating silicide stringers that may otherwise form along the liner dielectric structures In the depicted embodiment, the spacer etchback process produces a convex profile 127 at the edge of the resultant dielectric structure 126. To achieve this result, the preferred etchback process is a dry etch process that prevents the formation of a new concave surface during the etch back. If the etchback process produced a concave surface, it may be possible for sputtered silicide to get re-trapped inside that concavity thereby resulting in the formation of stringers that the etchback was originally intended to eliminate.

Figure 11:
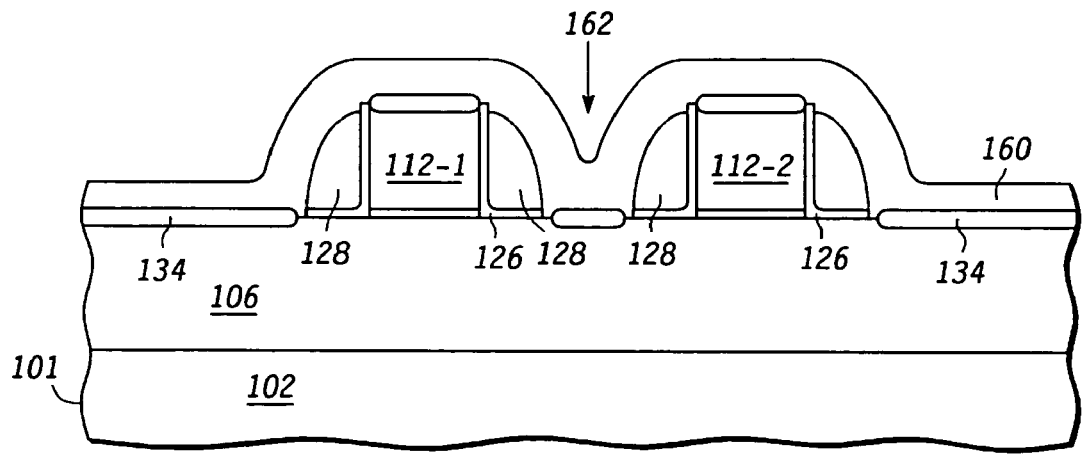
FIG. 11 illustrates a benefit provided by etch backed spacers 128 in densely populated regions of the wafer.

Referring to FIG. 11, an additional benefit of the spacer etchback sequences described above is the reduction of conductive filaments that are left behind in regions 162 between tightly spaced polysilicon lines 112-1 and 112-2 where the interlevel dielectric (ILD) is not able to completely fill these narrow gaps between the poly regions thereby leaving behind voids. Subsequent deposition of tungsten leaves behind tungsten stringers that can cause shorting of adjacent devices. A spacer etchback process results in better dielectric gapfill capability in an integrated circuit, thereby improving its reliability.

In the foregoing specification, the invention has been described with reference to specific embodiments. However, one of ordinary skill in the art appreciates that various modifications and changes can be made without departing from the scope of the present invention as set forth in the claims below. For example, the depicted embodiment uses a semiconductor on insulator (SOI) wafer 101. In other embodiments, however, conventional silicon bulk wafers are compatible with the stringer removal processing described. As another example, transistor 150 as depicted in the FIG. 8 has a single gate electrode, but other embodiments (e.g., in non-volatile memory devices) may include a floating gate structure as is well known. As another example, silicide formation is not restricted to metals that are mentioned here, but rare earth metals and other refractory metals may also be used when desired. These include Er, Yb, W, etc. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A semiconductor fabrication process, including
   forming a gate electrode overlying a gate dielectric overlying a substrate of a wafer;
   forming a liner dielectric layer including vertical portions adjacent sidewalls of the gate electrode and horizontal portions overlying an upper surface of the semiconductor substrate;
   forming an extension spacer adjacent a vertical portion and overlying a horizontal portion of the liner dielectric layer;
   following said forming of the extension spacer, removing exposed portions of the liner dielectric layer to form a liner dielectric structure covered by the extension spacer and to expose portions of the substrate;
   etching back the extension spacer to uncover extremities of the liner dielectric structure;
   following said etching back, removing at least part of the exposed extremities of the liner dielectric structure; and
   forming silicide on the exposed portions of the substrate.

2. The method of claim 1, wherein forming the liner dielectric layer comprises depositing a conformal oxide on the wafer.

3. The method of claim 2, wherein forming the extension spacer comprises depositing a silicon nitride layer on the liner dielectric layer and anisotropically etching the silicon nitride layer.

4. The method of claim 3, further comprising, prior to said etching back, depositing a metal layer non selectively over the wafer.

5. The method of claim 4, wherein depositing the metal layer comprises sputter depositing the metal layer.

6. The method of claim 1, wherein said removing at least part of the exposed extermities includes sputter cleaning the wafer.

7. The method of claim 6, wherein said sputter cleaning comprises radio frequency sputtering using argon ions.

\* \* \* \* \*